(12) United States Patent
Wu et al.

(10) Patent No.: US 8,424,146 B2
(45) Date of Patent: *Apr. 23, 2013

(54) ORAL CARE IMPLEMENT WITH MECHANICAL ENERGY HARVESTING

(75) Inventors: Donghui Wu, Bridgewater, NJ (US); Sharon Kennedy, Randallstown, MD (US); John P. Rouse, Hillsborough, NJ (US); John Gatzemeyer, Hillsborough, NJ (US)

(73) Assignee: Colgate-Palmolive Company, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/561,550

(22) Filed: Jul. 30, 2012

(65) Prior Publication Data

US 2012/0291213 A1 Nov. 22, 2012

Related U.S. Application Data

(63) Continuation of application No. 12/146,090, filed on Jun. 25, 2008, now Pat. No. 8,261,399.

(51) Int. Cl.
*A46B 9/04* (2006.01)

(52) U.S. Cl.
USPC ............................................ 15/167.1; 15/105

(58) Field of Classification Search ............ 15/105, 15/167.1
See application file for complete search history.

(56) References Cited

U.S. PATENT DOCUMENTS

| | | | | |
|---|---|---|---|---|
| 4,944,296 A | * | 7/1990 | Suyama | 607/79 |
| 5,876,207 A | * | 3/1999 | Sundius et al. | 433/216 |
| 6,106,294 A | * | 8/2000 | Daniel | 433/216 |
| 6,220,719 B1 | * | 4/2001 | Vetorino et al. | 362/192 |
| 6,330,730 B1 | * | 12/2001 | Davies et al. | 15/167.1 |
| 6,735,802 B1 | * | 5/2004 | Lundell et al. | 15/22.1 |
| 7,013,522 B2 | * | 3/2006 | Kumagai | 15/105 |
| 7,148,583 B1 | * | 12/2006 | Shau et al. | 290/1 R |
| 2001/0035723 A1 | * | 11/2001 | Pelrine et al. | 318/116 |
| 2005/0066461 A1 | * | 3/2005 | Chang | 15/105 |
| 2005/0172433 A1 | * | 8/2005 | Oliver et al. | 15/105 |
| 2005/0204490 A1 | * | 9/2005 | Kemp et al. | 15/22.1 |
| 2006/0254638 A1 | * | 11/2006 | Carmeli et al. | 136/205 |
| 2007/0257634 A1 | * | 11/2007 | Leschin et al. | 320/107 |
| 2009/0320227 A1 | * | 12/2009 | Cohen et al. | 15/167.1 |

FOREIGN PATENT DOCUMENTS

| | | | |
|---|---|---|---|
| EP | 0 324 120 A1 | * | 7/1989 |
| EP | 0 435 329 A2 | * | 7/1991 |
| FR | 1583683 | * | 11/1969 |
| FR | 2 751 185 A1 | * | 1/1998 |

(Continued)

*Primary Examiner* — Randall Chin

(57) ABSTRACT

A mechanical energy harvesting toothbrush may employ circuits and devices to convert mechanical energy into electrical energy. Such conversion can be done using piezoelectric devices to convert stresses and strains from bending of the toothbrush head and/or bristles during use, and can be done using electromagnetic generators involving passing a magnet through a coil to induce current. The resulting electric energy may be rectified, and stored in a storage device, such as a capacitor or rechargeable battery. A switching circuit may be configured to detect the level of energy stored in the storage device, and to close an electrical connection when a predetermined level of energy (e.g., a charge) has been reached. The predetermined level may correspond to a desired amount of brushing. The closing of the electrical connection may be used to power output devices when that desired amount of brushing has been reached.

9 Claims, 7 Drawing Sheets

FOREIGN PATENT DOCUMENTS

| | | | |
|---|---|---|---|
| JP | 01083268 | * | 3/1989 |
| RU | 2200446 | * | 3/2003 |
| SU | 1771035 | * | 10/1992 |

* cited by examiner

ORAL CARE IMPLEMENT WITH MECHANICAL ENERGY HARVESTING

CROSS-REFERENCE TO RELATED APPLICATIONS

The present application is a continuation of U.S. patent application Ser. No. 12/146,090 filed Jun. 25, 2008, now allowed as U.S. Pat. No. 8,261,399, the content of which is hereby incorporated by reference in its entirety.

BACKGROUND OF THE INVENTION

The present application pertains to an oral care implement, in particular to a toothbrush with mechanical energy harvesting device and circuitry. Tooth brushing is part of a daily oral hygiene activity. Proper dental care involves regular flossing, brushing and dental checkups. Dentists generally recommend that an individual brush his or her teeth for a minimum interval per cleaning, such as two minutes. Despite such recommendations, many individuals, especially young children, do not regularly brush their teeth for the recommended minimum interval. Such habits often can be attributed to the individual regarding tooth brushing as a mundane duty with few pleasurable aspects.

BRIEF SUMMARY OF THE INVENTION

The present invention pertains to an oral care implement with mechanical energy harvesting device and circuitry. In one aspect, the oral care implement can signal to a user when a suitable level of brushing has been accomplished.

A number of mechanical energy harvesting circuits may be used in an oral care implement to capture mechanical energy from brushing, and to convert that mechanical energy into electrical energy that can be used at a later time. For example, an oral care implement may have a handle, head with tooth cleaning elements, a mechanical energy harvesting device or circuit (to convert mechanical energy into electrical energy), an electrical energy storage device (to store the electrical energy) and a switching circuit to close an electrical connection with the storage device when a predetermined voltage has been reached.

In one aspect, the predetermined voltage may be determined by taking into account typical brush stroke length, stroke number and force of brushing.

In one aspect, the mechanical energy harvesting circuit can include one or more piezoelectric devices positioned to generate electricity in response to deflections or bending of the toothbrush head and/or tooth cleaning elements.

In one aspect, the harvesting circuit can include one or more electromagnetic generators, having wire coils and moveable magnets, to induce an electric current as the magnets pass through the coils due to movement of the toothbrush during brushing.

In another aspect, a rectifier circuit may be used to rectify the electricity generated by the harvesting circuit before storage in the storage device, and a voltage regulator may be used to provide a constant level output when the storage device is being discharged.

Other features and embodiments are described in the sections that follow.

BRIEF DESCRIPTION OF THE DRAWINGS

The features herein will become more fully understood from the detailed description given herein below, and the accompanying drawings, which are given by way of non-limiting illustration only.

DETAILED DESCRIPTION OF THE INVENTION

The following detailed description refers to the accompanying drawings. The same reference numbers in different figures identify the same or similar elements.

As illustrated in FIGS. 1A-1D, an oral care implement, such as toothbrush construction 100, 300, 400, 500, may include a brush head 101 and a handle 102. The head 101 may be a refill head that is removably connected to handle 102, or it may be integrally formed and attached to the handle 102.

The head 101 may include one or more tooth cleaning elements, such as a field of bristles 103. As used herein, the term "tooth cleaning elements" or "cleaning elements" includes any type of structure that is commonly used or is suitable for use in providing oral health benefits (e.g., tooth cleaning, tooth polishing, tooth whitening, massaging, stimulating, etc.) by making contact with portions of the teeth and gums. Such tooth cleaning elements include but are not limited to tufts of bristles that can be formed to have a number of different shapes and sizes and elastomeric cleaning members that can be formed to have a number of different shapes and sizes, or a combination of both tufts of bristles and elastomeric cleaning members.

Figure 1A:
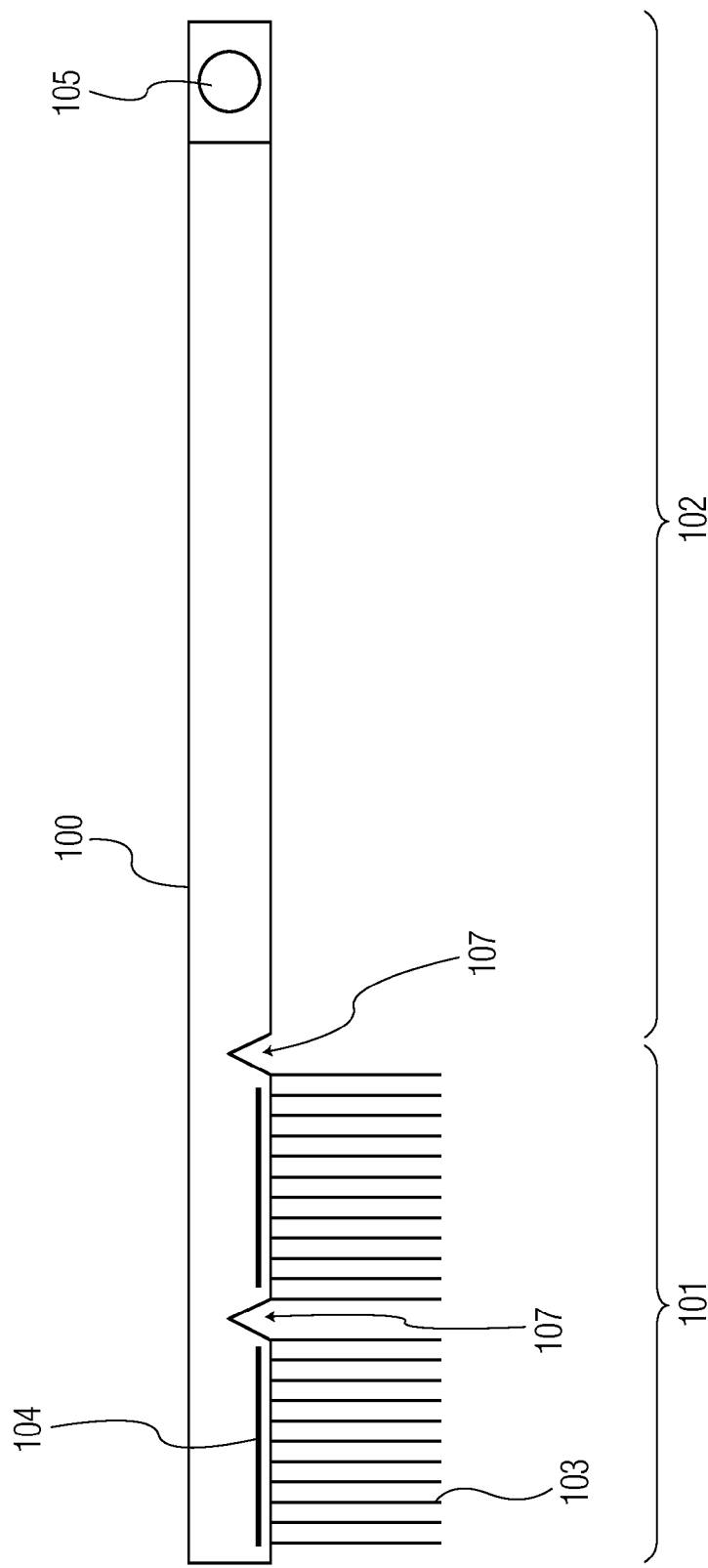
FIG. 1A is a longitudinal cross-sectional view of a toothbrush construction in accordance with at least one aspect of the invention.

Referring to the toothbrush construction 100 of FIG. 1A, the head 101 may also include one or more energy producing devices, such as piezoelectric devices 104. The piezoelectric devices 104 may be arranged in contact with, or proximate to, the bristles 103, so that movement of the bristles causes stress or strain on the devices 104. For example, a given bristle may be attached to a cantilever portion of a micro-electro-mechanical system (MEMS) device to stress or strain the device 104. MEMS cantilevers are conventionally fabricated from silicon nitride (SiN), silicon (Si), or various polymers. In a cantilever MEMS device, the proximal end of the cleaning element (e.g., bristle or elastomeric element) is attached to the "cantilevered" portion of the MEMS device. In this construction, z-axis movement of the cleaning element causes deflections in the MEMS device which invokes electrical potential. Nevertheless, the amount of electrical energy depends on the modulus of elasticity of the material, the thickness of the cantilevered portion and the piezo-resistive material of the MEMS device.

The stress or strain causes the piezoelectric device 104 to generate a small amount of electrical energy, such as a voltage. As will be explained below, the head 101 may also include wiring and circuitry to carry this voltage to other parts of the toothbrush 100, and that electrical energy may eventually be used to power one or more output devices 105.

Figure 1B:
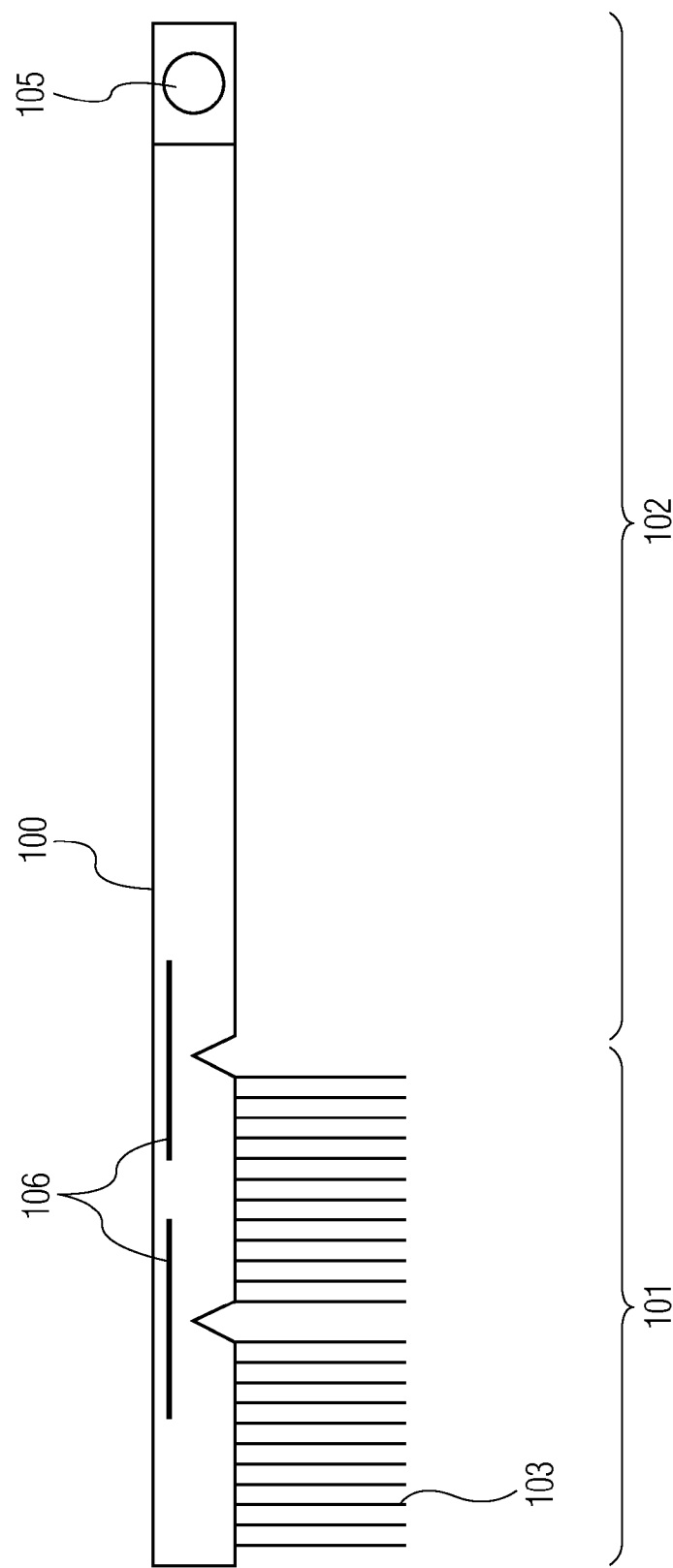
FIG. 1B is a longitudinal cross-sectional view of an alternative toothbrush construction in accordance with at least one aspect of the invention.

Referring to the toothbrush construction 300 of FIG. 1B, the head 101 may also include one or more piezoelectric devices 106 that are stressed or strained by the natural bending of the head 101 along the longitudinal axis X-X that occurs during a normal tooth brushing operation. The amount of bending or deflection along the longitudinal axis can depend on the type of material and thickness of the head 101. For example, rigid plastics or resins, such as polypropylene, may be used to form the head 101. To provide a controlled deflection profile and/or focus the bending in regional areas, the head 101 may include one or more flexing joints 107 disposed transverse (e.g., along a Y-axis) to the longitudinal axis X-X. In the one construction, the joints 107 may be disposed perpendicular to the longitudinal axis of the toothbrush. In other constructions, the joints 107 may be notches or grooves, having less head material in the area than in the immediate surrounding portion of the head 101. In the alternative construction, the joints 107 may be formed of a less rigid material than other portions of the head (e.g., rubberized or elastomeric sections at the joints 107). The flexibility of the head 101 (e.g., Z-axis movement) facilitates enhanced cleaning of the lingual and facial surfaces with dentifrice on the tooth cleaning elements. In addition, Z-axis movement of the tooth cleaning elements facilitates improved interproximal cleaning as well as cleaning of the crowns of the molars of the teeth of a human. In this way, a toothbrush provides improved cleaning capabilities and energy harvesting features.

The piezoelectric devices 106 may be placed near the joints 107 to maximize the stress or strain experienced by the device 106 as the head deflects or bends along the longitudinal axis X-X during brushing. Nevertheless, the head 101 may twist to have a torsional component which causes strain on the piezoelectric device 106. The changes in strain on device 106 invoke an electrical response in the piezoelectric device. Hence, during a brushing operation, piezoelectric devices 106 can experience a combination of different types of movements including, for example, a deflection along the longitudinal axis and a twisting component about the same longitudinal axis.

Figure 3:
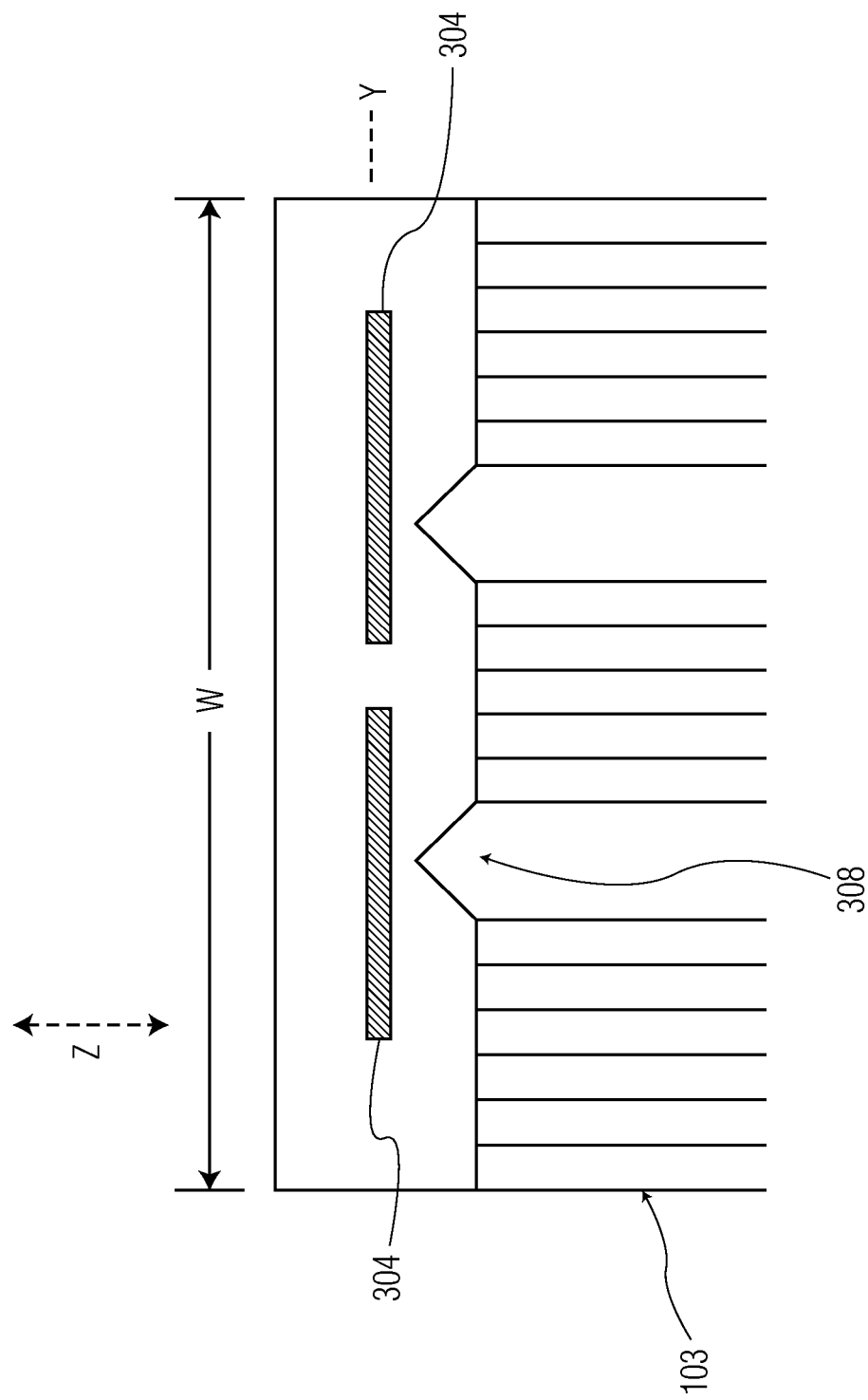
FIG. 3 is a cross-section view of an alternative head construction taken along the width of a toothbrush in accordance with at least one aspect of the invention.

As illustrated in FIG. 1B, the piezoelectric devices 106 may be placed directly above and centered relative a flexing joint 107. In alternative head construction shown in FIG. 3, the joints or grooves 308 may be disposed along or generally parallel to the longitudinal axis X-X of the toothbrush. In this construction, the grooves 308 are disposed across the width W of the head. Piezoelectric device 304 may be placed directly above and centered with respect to a flexing joint 308. Alternatively, the device 304 may be placed under the bristle field similar to device 104. In these longitudinal joint constructions, the head 101 may flex in side-to-side motions (e.g., width) and provide improved energy harvesting features.

Referring to FIGS. 1A and 1B, with the piezoelectric devices 104, 106, the amount of electrical energy generated will vary proportionally with the amount of force used to brush a user's teeth. Individual performance ranges will depend on the piezoelectric material type and configuration chosen, and any piezoelectric material type and configuration may be used as desired. Additionally, different types of piezoelectric devices may be used. The device 106 may be larger in structure than device 104. In one construction, device 104, 106 may be a microelectromechanical system (MEMS) device that includes a cantilever portion attached to each of a plurality of the bristles 103.

Figure 1C:
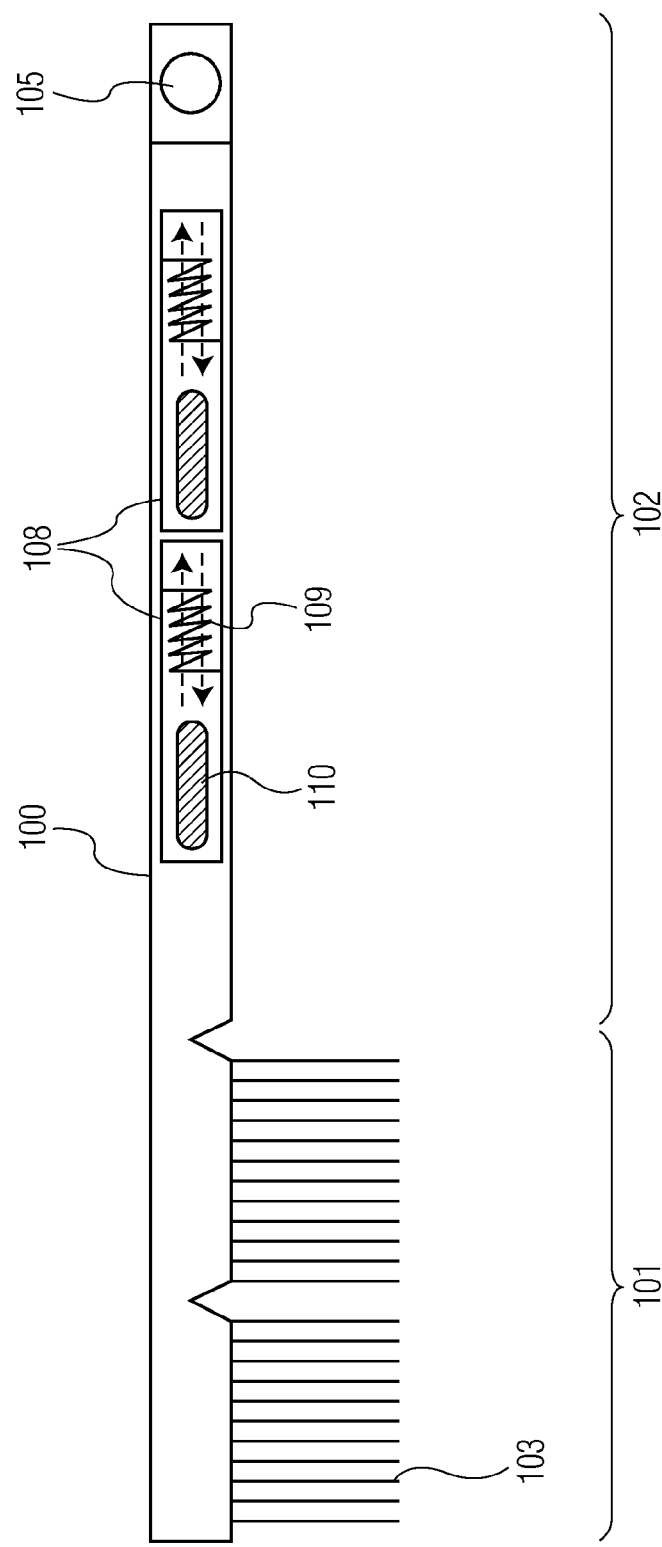
FIG. 1C is a longitudinal cross-sectional view of an alternative toothbrush construction in accordance with at least one aspect of the invention.

Referring to the toothbrush construction 400 of FIG. 1C, the toothbrush 400 may also include one or more electromagnetic generators 108. Each generator 108 may include a wire coil 109 and a magnet 110 that is configured to freely move through the coil 109 as the toothbrush 100 is moved back and forth along its longitudinal axis (horizontal, as depicted in FIG. 1). This configuration may be accomplished in a variety of ways. For example, the coil 109 may be embedded within a tube of a non-conducting material having a low coefficient of friction, and the magnet 110 (which may also be encased in a similar material) may be centrally aligned within the tube. The non-conducting material having a low friction should be biocompatible. An example of such a material is polycarbonate.

As the toothbrush 400 is moved back and forth, the magnet 110 moves back and forth through the coil 109, inducing a small amount of current in the coil 109. The amount of current generated will depend on several factors, such as the strength of the magnet, the number of loops in the coil, and the speed at which the magnet travels. The head 101 may include additional wiring and circuitry to convey this current to other parts of the toothbrush, as will be explained below.

Figure 1D:
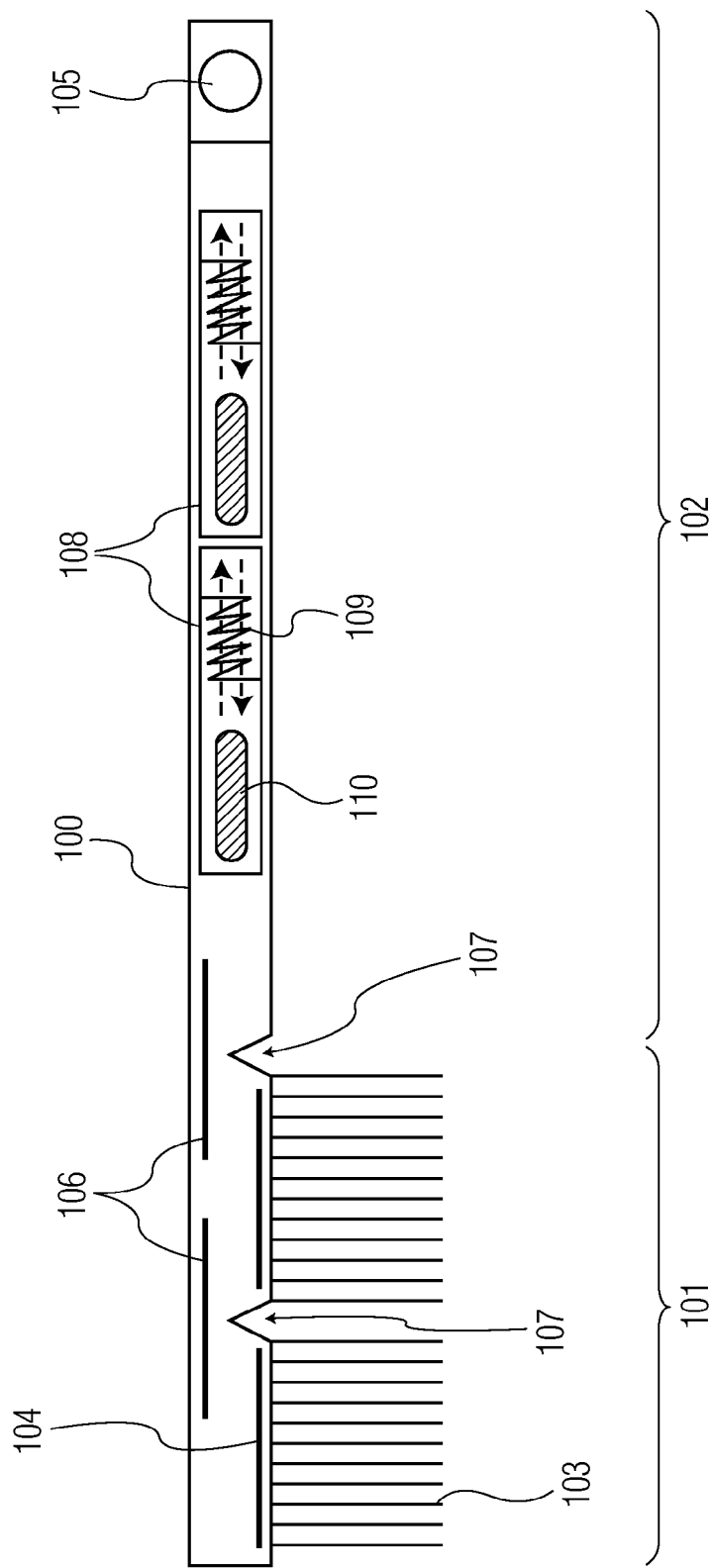
FIG. 1D is a longitudinal cross-sectional view of an alternative toothbrush in accordance with at least one aspect of the invention.

Referring to FIG. 1D, toothbrush construction 500 may include a combination of the features of toothbrush constructions 100, 300, and 400 for energy harvesting.

Figure 2:
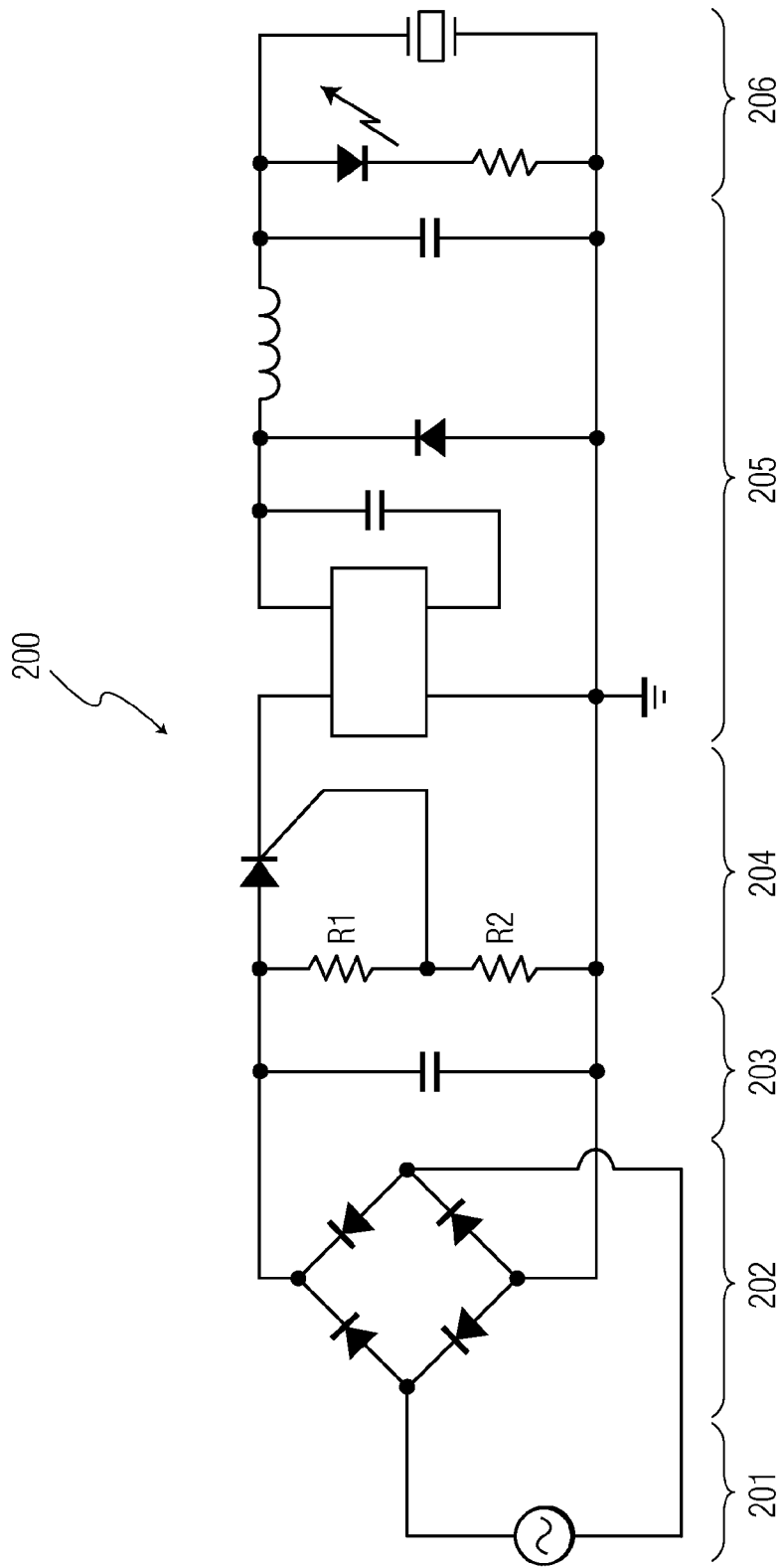
FIG. 2 is an electrical schematic illustrating an exemplary circuit configuration in accordance with at least one aspect of the invention.

FIG. 2 illustrates an electrical schematic that can be used with the toothbrush 100. As illustrated, an energy harvesting device 201 represents the devices 104, 106 and/or electromagnetic generators 108 that are in the toothbrush 100. The toothbrush 100 may have one, some, or all of these as energy harvesting devices, and they are generically represented in FIG. 2.

The energy harvesting device 201 may generate an alternating current (AC) output due to the back-and-forth motion of the toothbrush 100 and/or bending of the head 101 and/or bristles 103. For example, the generator 108 may generate an alternating current (AC) output in use (e.g., generating a positive current when the toothbrush is moved in one direction, and a negative current when the toothbrush is moved in an opposite direction). This output may be supplied to a rectifier circuit 202 to convert the AC output to a DC output. Any type of rectifier circuit 202 may be used, depending on the type of output generated by the particular piezoelectric devices 104, 106 and/or the generator 108, and on the type of output desired.

The rectifier circuit 202 may then be coupled to an electrical energy storage device 203. Device 203 may be any type of device that can receive electrical energy (a charge) and store it for later use. For example, a capacitor or rechargeable battery may be used to store the electrical energy from the rectifier 202 in the form of a stored charge. The actual amount of charge stored will depend on the type and number of energy harvesting devices 201 used in the toothbrush, and the electrical energy storage device 203 may act as an integrator summing the charges generated by each movement, bending, or stroke of the toothbrush.

The energy stored in energy storage device 203 will accumulate as the toothbrush is used, and a switch circuit 204 may be used to regulate the release of that energy. The switch circuit 204 may keep an electrical connection between the storage device 203 and an output load 206 in an open state until the voltage level in the storage device 203 reaches a predetermined level, and then close that connection when the voltage reaches that predetermined level to discharge the device 203 and to allow the output load 206 to use the stored energy. One example embodiment of the switch circuit 204 is a silicon-controlled rectifier (SCR), or a thyristor, configuration, as illustrated in FIG. 2. By knowing the SCR's turn-on voltage, and the desired predetermined voltage for the storage device 203, the ratio of resistor values R1/R2 can be chosen so that the SCR turns on when the voltage across the device 203 has reached that predetermined voltage level.

That predetermined voltage level can be chosen to reflect a suitable amount of tooth brushing. For example, this can be based on a typical stroke length and/or force of brushing. If a typical tooth brushing is expected to run for S strokes at a force of F Newtons before the switch 204 is to be closed, and a typical stroke is L m in length, then it is known that the typical brushing will generate (S strokes)*(L m/stroke)*F N=X Joules of energy. When the accumulated voltage in the storage device 203 corresponds to that amount of work done during the brushing, the switch will close.

During brushing, the piezoelectric devices 104, 106 will generate a known amount of voltage for a given amount of bending force, and the electromagnetic generator 108 will generate a known amount of current for each time the magnet 110 passes through coil 109. This energy will be stored in the storage device 203, and accordingly, the storage device 203 acts as a form of integrator, totaling up the mechanical work performed by the user's brushing. If the user brushes faster, or harder, the storage device 203 will accumulate charge faster than if the user brushes slower or with less force.

When the predetermined voltage has been accumulated, the switch circuit 204 may close the electrical connection, and the stored voltage in device 203 may be discharged and used for a variety of purposes. For example, output devices 206 may include devices that signal to the user when sufficient brushing has occurred. Such signaling devices may take many forms, such as a light-emitting diode (LED) or other illuminated display, a speaker generating an audible tone, and/or a mechanical vibrator. For example, a display may be placed on the toothbrush to assist in reporting output. The display may include light-emitting diode (LED) displays, an alphanumeric display screen, individual lights, or any other desired form of visual output. For example, the display may be an Organic LED or electroluminescent sheet that can be tuned to provide a desired luminescent characteristic such as color, temperature, intensity etc. OLED or EL (electroluminescent) technology can be embedded into the toothbrush molding, or can be applied to the surface of the toothbrush body. It should be understood by those skilled in the art that the present invention is not limited to any particular type of display.

In some implementations, the toothbrush relies entirely on the mechanically-harvested energy to run these output devices, so the devices may be configured to be very low power devices. For example, an energy-efficient LED with a current limiting resistor may be used, or a DC piezoelectric buzzer as an audio device, or a piezoelectric vibrator as a vibrating device.

Output devices 206 can perform other functions besides informing the user when brushing is complete. For example, the energy can be used to power components, such as micro pumps and pump valves, to deliver actives at predetermined stages during brushing. For example, a separate active or flavor can be automatically delivered midway through the brushing. The energy can alternatively be used as a supplement to energy provided by another battery on the toothbrush (e.g., for playing video games, playing music, or any other battery-operated function), or to recharge such a separate battery. In some configurations, toothbrush 100, 300, 400, 500 may be a traditional electric vibratory toothbrush (with vibrating head/bristles, motor, power supply, etc.), and the energy harvesting circuitry may be used as a supplement to recycle some of the mechanical energy in the brushing and vibration of the toothbrush and use that energy to assist in powering and/or recharging a battery of the device.

The toothbrush may include a voltage regulator 205 to provide a constant voltage to the output device 206. For example, National Instrument's LM2674 or LM3670 integrated circuit may be used for this purpose.

Other embodiments will be apparent to those skilled in the art from consideration of the specification disclosed herein. For example, the FIG. 2 schematic is merely an example. While FIG. 2 represents energy harvesting devices 201 generically, and shows a single example rectifier 202, storage 203, switch, 204, etc., multiple devices 201 may be used and separate circuitry can be supplied for different types of devices 201.

Figure 4:
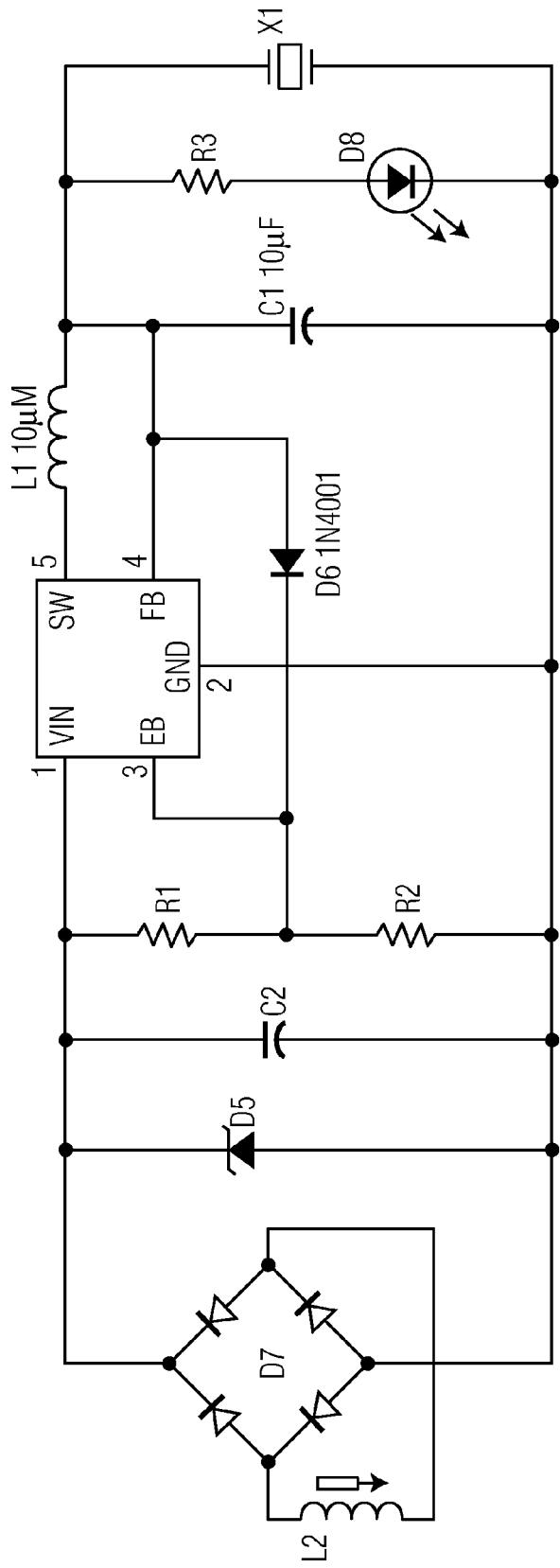
FIG. 4 is an electrical schematic illustrating an alternative circuit configuration.

FIG. 4 illustrates an alternate circuit configuration. This alternate configuration can use an integrated circuit (e.g., part no. LM3670_SOT23_5 U1), instead of the SCR in FIG. 2, to control the switching of the circuit. The use of this integrate circuit for the switching may allow the easier turning on/off of the device at the enable pin (labeled pin 3, or "EB", in the Figure), allowing for a more efficient system. The FIG. 3 configuration also shows the addition of a Zener diode D5. The Zener diode may protect against the generation of too much voltage, by short-circuiting the source if too much voltage is generated. Such a component may help prevent damage to the circuitry if, for example, the user vigorously brushes or shakes the toothbrush for an extended period of time.

It is intended that the specification and examples be considered as exemplary only, with a true scope and spirit of the invention being indicated by the following claims.

We claim:

1. An oral care implement, comprising:
   a head coupled to a handle, the head having to field of cleaning elements, at least one flex joint, and a piezoelectric device located at the flex joint;
   a handle having an electromagnetic generator with a coil and a magnet configured to pass through the coil;
   a rectifier circuit coupled to the coil and the piezoelectric device; and
   a storage device for storing electrical energy from the rectifier circuit.

2. The oral care implement of claim 1, wherein the flex joint is disposed along a longitudinal axis of the head.

3. The oral care implement of claim 1, wherein the flex joint is disposed along a width of the head.

4. The oral care implement of claim 1, wherein the energy harvesting device includes a cantilever operatively coupled to at least one of the cleaning elements.

5. The oral care implement of claim 1, further comprising a switch circuit, coupled to the storage device for storing electrical energy, and configured to maintain an electrical connection in an open position until a level in the storage device meets a predetermined level; and to close the electrical connection when the level in the storage device reaches the predetermined level.

6. The oral care implement of claim 5, wherein the predetermined level is based on predetermined average brush stroke length and force values.

7. The oral care implement of claim 1, wherein the storage device is a capacitor.

8. The oral care implement of claim 1, wherein the flex joint further comprises one or more notches in the head.

9. The oral care implement of claim 1, wherein the flex joint further comprises a less rigid material as compared with material from other portions of the head.

* * * * *